United States Patent
Sasaki et al.

(10) Patent No.: US 9,083,353 B2
(45) Date of Patent: Jul. 14, 2015

(54) SEMICONDUCTOR DEVICE AND ELECTRONIC DEVICE

(71) Applicant: Renesas Mobile Corporation, Tokyo (JP)

(72) Inventors: Hajime Sasaki, Tokyo (JP); Hirohiko Ito, Tokyo (JP); Shikiko Nachi, Tokyo (JP); Takanobu Naruse, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 53 days.

(21) Appl. No.: 13/952,590

(22) Filed: Jul. 27, 2013

(65) Prior Publication Data

US 2014/0043075 A1 Feb. 13, 2014

(30) Foreign Application Priority Data

Aug. 10, 2012 (JP) ................................. 2012-178426

(51) Int. Cl.
 *H03K 5/01* (2006.01)
 *H03L 7/08* (2006.01)
 *G06F 1/10* (2006.01)
 *H03K 5/135* (2006.01)

(52) U.S. Cl.
 CPC .. *H03L 7/08* (2013.01); *G06F 1/10* (2013.01); *H03K 5/135* (2013.01)

(58) Field of Classification Search
 None
 See application file for complete search history.

(56) References Cited

U.S. PATENT DOCUMENTS

| 6,002,282 A * | 12/1999 | Alfke .............................. 327/165 |
| 6,794,912 B2 * | 9/2004 | Hirata et al. ................... 327/158 |
| 7,222,036 B1 * | 5/2007 | Thorne ............................. 702/79 |
| 7,512,201 B2 * | 3/2009 | Kelly et al. ..................... 375/356 |
| 7,710,171 B2 * | 5/2010 | Kim et al. ....................... 327/158 |
| 2006/0087354 A1 * | 4/2006 | Minzoni ......................... 327/158 |
| 2008/0024179 A1 * | 1/2008 | Hashim et al. ................. 327/158 |
| 2009/0267665 A1 * | 10/2009 | Lee et al. ....................... 327/158 |
| 2012/0169388 A1 * | 7/2012 | Ma .................................. 327/158 |

FOREIGN PATENT DOCUMENTS

| JP | 2005-316879 A | 11/2005 |
| JP | 2009-128313 A | 6/2009 |

* cited by examiner

*Primary Examiner* — Tuan T Lam

(74) *Attorney, Agent, or Firm* — Miles & Stockbridge P.C.

(57) ABSTRACT

A semiconductor device includes a clock input circuit that receives an external clock signal, a PLL circuit for input timing control that performs phase adjustment between the external clock signal and a delayed clock signal to generate an internal clock signal used to acquire input data, and a delay circuit that delays the internal clock signal to output the internal clock signal that is delayed to a PLL circuit for input timing control as a delayed clock signal. The semiconductor device further includes a PLL circuit for output timing control that performs phase adjustment between the external clock signal and a delayed clock signal to generate an internal clock signal used to output output data, and a delay circuit that delays the internal clock signal to output the internal clock signal that is delayed to the PLL circuit for output timing control as a delayed clock signal.

12 Claims, 7 Drawing Sheets

SEMICONDUCTOR DEVICE AND ELECTRONIC DEVICE

CROSS-REFERENCE TO RELATED APPLICATIONS

This application is based upon and claims the benefit of priority from Japanese patent application No. 2012-178426, filed on Aug. 10, 2012, the disclosure of which is incorporated herein in its entirety by reference.

BACKGROUND

The present invention relates to a semiconductor device and an electronic device using the semiconductor device.

Japanese Unexamined Patent Application Publication No. 2005-316879 discloses a configuration of a timing adjustment circuit that uses one phase locked loop (PLL) circuit and adjusts data input timing and data output timing.

Japanese Unexamined Patent Application Publication No. 2009-128313 discloses a configuration of a car navigation system.

SUMMARY

The present inventors have found various problems in the development of semiconductor devices. Each embodiment disclosed in the present application provides a semiconductor device suitable for an electronic device, for example. Further detailed features will be made apparent from the description of this specification and the accompanying drawings.

One exemplary aspect disclosed in the present specification includes a semiconductor device, which includes a PLL control circuit that generates an input clock for reception and a PLL control clock that generates an input clock for transmission.

According to an embodiment disclosed in the present application, it is possible to provide an excellent semiconductor device suitable for, for example, an electronic device and the like.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

<Configuration Example of Electronic Device>

Figure 1:
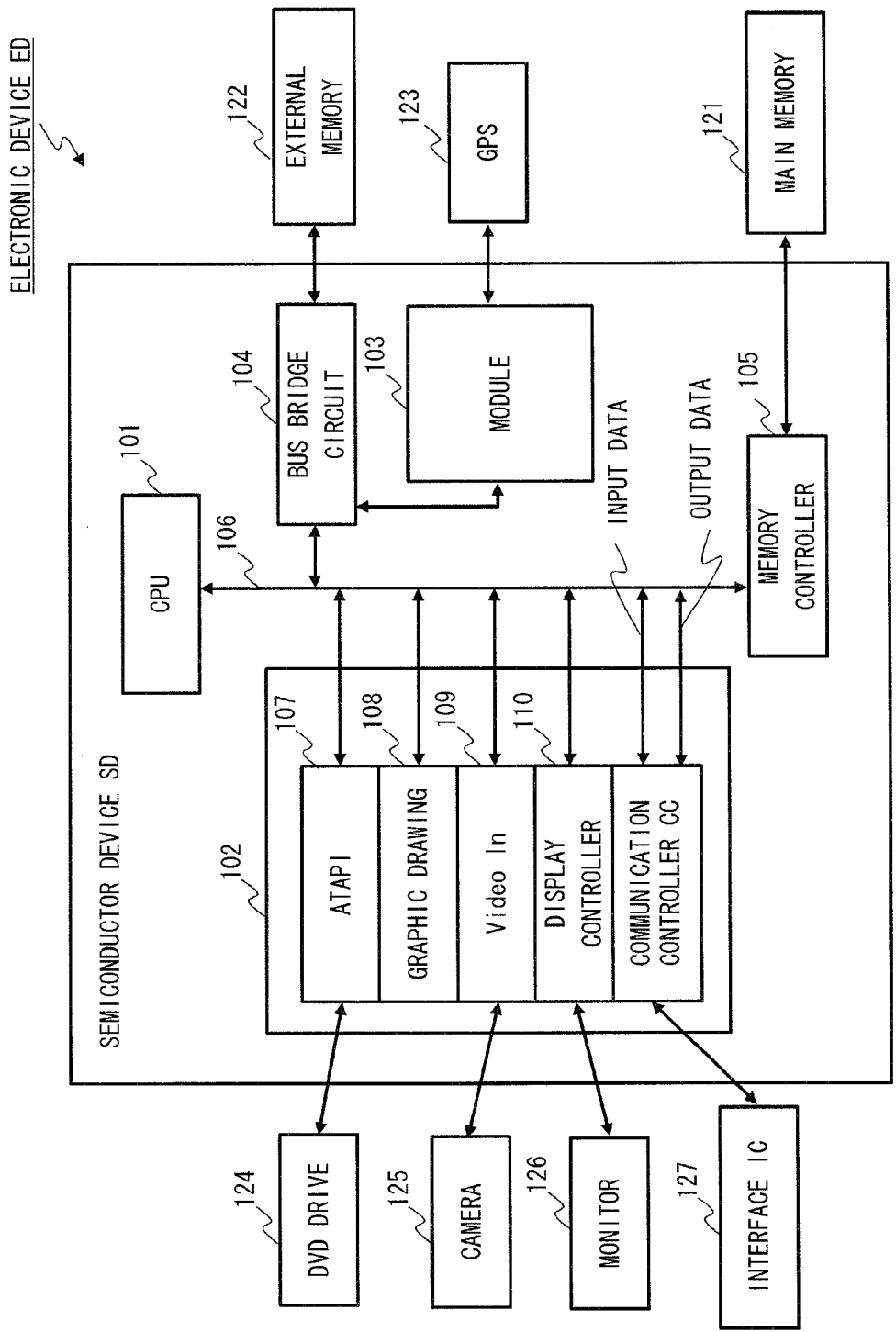
FIG. 1 is a configuration diagram of a car navigation system according to a first embodiment.

First, with reference to FIG. 1, a configuration example of a car navigation system will be described as one example of an electronic device ED according to an embodiment. The car navigation system includes a semiconductor device SD, a main memory 121, an external memory 122, a global positioning system (GPS) 123, a digital versatile disc (DVD) drive 124, a camera 125, a monitor 126, and an interface IC 127.

The semiconductor device SD includes a central processing unit (CPU) 101, a module 102, a module 103, a bus bridge circuit 104, a memory controller 105, and a bus 106. Further, the CPU 101, the module 102, and the bus bridge circuit 104 are connected through the bus 106. Further, the module 103 is connected to the bus bridge circuit 104.

The memory controller 105 is connected to the main memory 121, and controls communication between the CPU 101 and the main memory 121.

The module 102 includes an ATA Packet Interface (ATAPI) 107, a graphic drawing 108, a Video In 109, a display controller 110, and a communication controller CC. The module 102 is used to control the DVD drive 124, the camera 125, the monitor 126, and the interface IC 127. Further, the module 102 controls communication with the interface IC 127 using the communication controller CC. The interface IC 127 executes processing to communicate with a network such as an in-vehicle LAN, for example.

(Description of Comparative Example)

Figure 6:
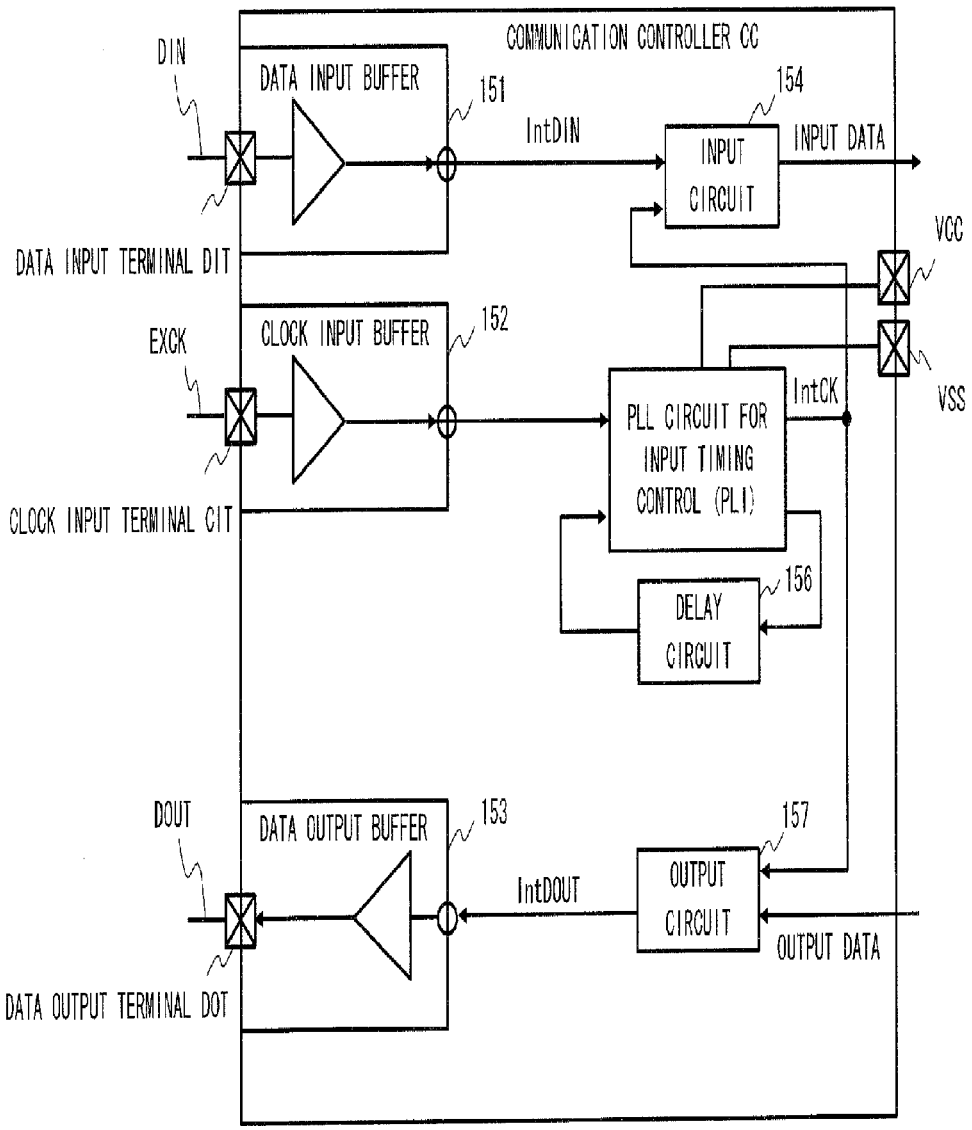
FIG. 6 is a configuration diagram of a semiconductor device used in a comparative example.

Subsequently, with reference to FIG. 6, a configuration of a comparative example of the communication controller CC included in the semiconductor device SD shown in FIG. 1 reviewed by the present inventors will be described.

The communication controller CC according to the comparative example includes a data input buffer 151 that receives data (external input data DIN) output from an external device through a data input terminal DIT, a data output buffer 153 that outputs data (external output data DOUT) to an external device through a data output terminal DOT, and a clock input buffer 152 that receives an external input clock signal EXCK through a clock input terminal CIT. The communication controller CC is used to control communication with an interface IC or the like when the semiconductor device SD performs communication with the interface IC or the like. Further, the communication controller CC includes a PLL circuit for input timing control PLI that multiplies the external clock signal EXCK input to the clock input buffer 152 to generate an internal clock signal IntCK. The PLL circuit for input timing control PLI adjusts a phase of the internal clock signal IntCK using a delay circuit 156. An input circuit 154 acquires data (internal input data IntDIN) input to the data input buffer 151 using the internal clock signal IntCK. An output circuit 157 outputs data (internal output data IntDOUT) to the data output terminal 153 using the internal clock signal. Further, power is supplied to the PLL circuit for input timing control PLI through a high-potential-side power supply terminal VCC and a low-potential-side (ground potential) power supply terminal VSS.

Figure 7:
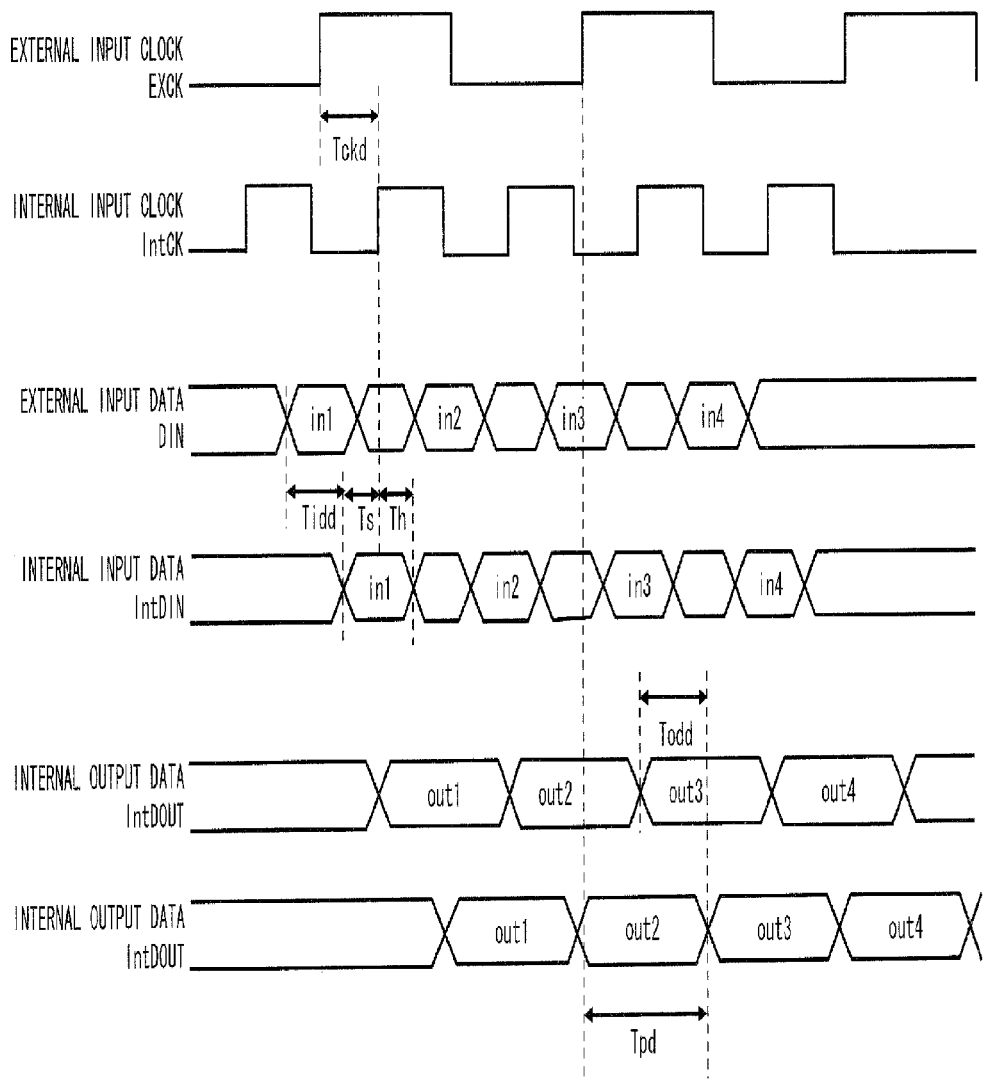
FIG. 7 is a timing chart showing an operation of the semiconductor device used in the comparative example.

Now, with reference to FIG. 7, a timing chart in data processing in the communication controller CC shown in FIG. 6 will be described. A period Tckd indicates a phase difference between the external input clock EXCK and the internal input clock IntCK. The phase difference Tckd includes a delay time in the clock input buffer 152, a delay time in the delay circuit 156, and a timing adjustment time in the PLL circuit for input timing control PLI. A period Tidd indicates a phase difference between the external input data DIN and the internal input data IntDIN. The period Tidd includes a delay time in the data input buffer 151.

A period Ts is a setup time of the internal input data IntDIN, and a period Th is a hold time of the internal input data IntDIN. The PLL circuit for input timing control PLI adjusts the phase of the internal input clock IntCK so as to satisfy the setup time Ts and the hold time Th that are determined in advance.

A period Todd indicates a phase difference between the internal output data IntDOUT and the external output data DOUT. The period Todd includes a delay time in the data output buffer 153 and a delay time in a data communication path and the like. A period Tpd is a delay time from when the external input clock ExCK is input to when the external output data DOUT is output. It is required that the minimum value and the maximum value of the delay time Tpd are predetermined values.

As described above, the setup time Ts, the hold time Th, and the delay time Tpd are required to satisfy the specification defined by a standard, the external device or the like. When a low-speed clock (e.g., about 33 MHz) is used as the external input clock EXCK, the setup time Ts, the hold time Th, and the delay time Tpd are able to easily satisfy the specification. However, when the clock frequency is increased and a high-speed clock (e.g., 100 MHz or larger) is used as the external input clock EXCK, it is difficult for the setup time Ts, the hold time Th, and the delay time Tpd to satisfy the specification. It is required that the maximum value and the minimum value of the delay time Tpd are set to desired values by adjustment of the delay amount by the delay circuit 156. However, when the delay amount of the delay circuit 156 is increased and the phase difference Tckd is increased, it may be possible that the setup time Ts is not satisfied. In contrast, when the delay amount of the delay circuit 156 is decreased and the phase difference Tckd is decreased, it may be possible that the hold time Th is not satisfied.

(First Embodiment)

<Configuration Example of Communication Controller>

Figure 2:
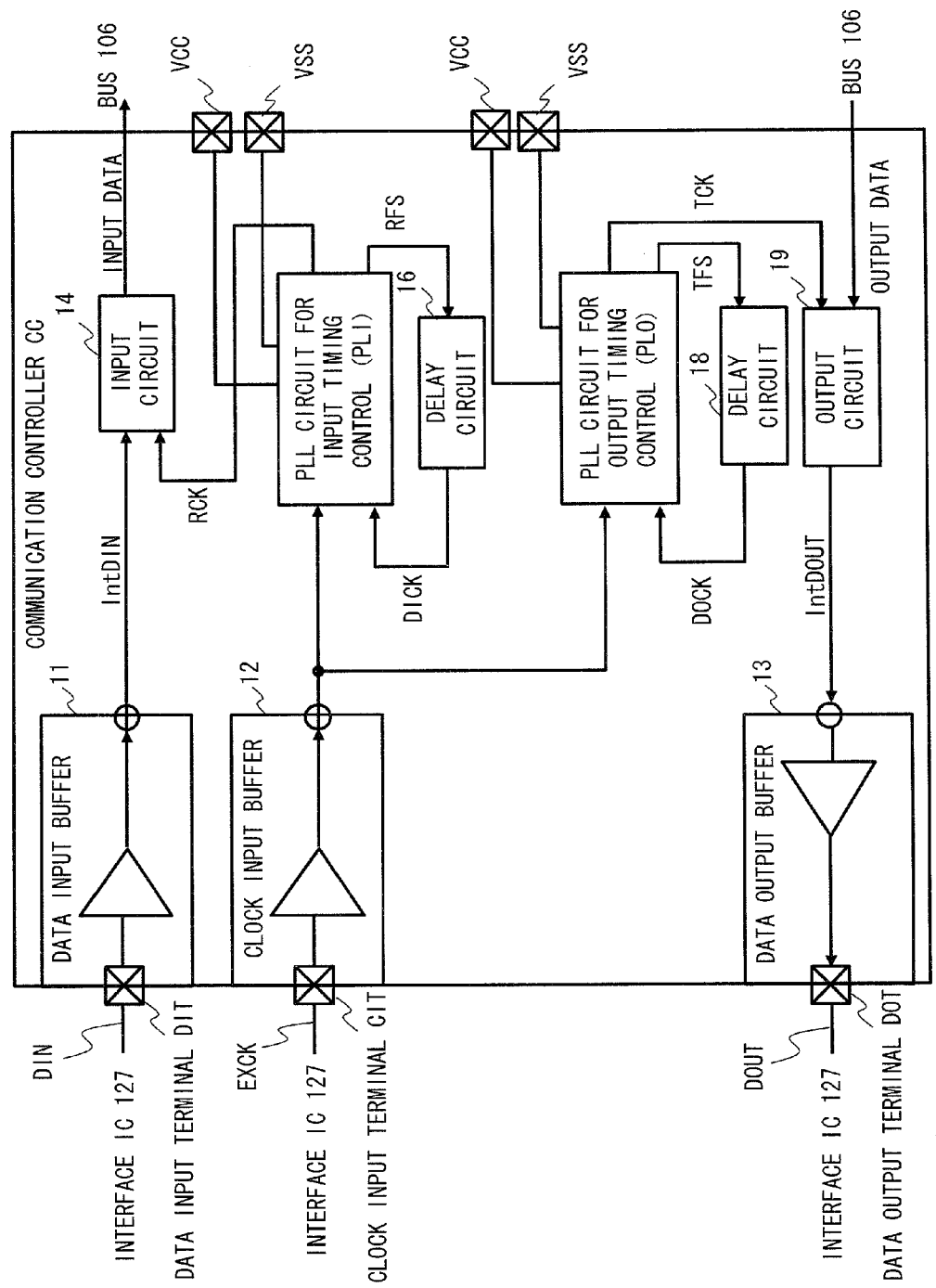
FIG. 2 is a configuration diagram of a communication controller according to the first embodiment.

Hereinafter, with reference to the drawings, embodiments will be described. With reference to FIG. 2, a configuration example of the communication controller CC included in the module 102 shown in FIG. 1 will be described. The communication controller CC includes a data input buffer 11, a clock input buffer 12, a data output buffer 13, an input circuit 14, a PLL circuit for input timing control PLI, a delay circuit 16, a PLL circuit for output timing control PLO, a delay circuit 18, and an output circuit 19. Further, the PLL circuit for input timing control PLI and the PLL circuit for output timing control PLO are supplied with power from a low-potential-side (ground potential) power supply terminal VSS and a high-potential-side power supply terminal VCC.

The data input buffer 11 receives input data (external input data DIN) output from the outside of the communication controller CC through a data input terminal DIT. The data input buffer 11 outputs the received external input data DIN to the input circuit 14 as internal input data IntDIN.

The clock input buffer 12 receives an external input clock EXCK output from the interface IC 127 through a clock input terminal CIT. The clock input buffer 12 outputs the external input clock EXCK to the PLL circuit for input timing control PLI and the PLL circuit for output timing control PLO. Since the data input buffer 11 and the clock input buffer 12 use the same circuit configuration, the same delay time is added in the data input buffer 11 and the clock input buffer 12.

The data output buffer 13 outputs data from the output circuit 19 (internal output data IntDOUT) to the interface IC 127 or the like through a data output terminal DOT. The data output from the data output buffer 13 to the interface IC 127 or the like is referred to as external output data DOUT.

The PLL circuit for input timing control PLI performs phase adjustment between a delayed clock signal DICK output from the delay circuit 16 and the external clock signal EXCK output from the clock input buffer 12. Specifically, the PLL circuit for input timing control PLI outputs an internal clock signal for reception RCK which is obtained by adjusting the phase of the external clock signal EXCK output from the clock input buffer 12 so as to be in phase with the delayed clock signal DICK output from the delay circuit 16 to the input circuit 14. The PLL circuit for input timing control PLI also outputs a feedback signal RFS generated based on the internal clock signal for reception RCK to the delay circuit 16.

The delay circuit 16 adds a predetermined delay time to the feedback signal RFS to generate the delayed clock signal DICK. The delay circuit 16 outputs the delayed clock signal DICK that is generated to the PLL circuit for input timing control PLI.

The input circuit 14 acquires the internal input data IntDIN output from the data input buffer 11 based on the internal clock signal for reception RCK output from the PLL circuit for input timing control PLI. The input circuit 14 outputs the internal input data IntDIN that is acquired to the CPU 101 or the memory controller 105 through the bus 106 as input data.

The PLL circuit for output timing control PLO performs phase adjustment between a delayed clock signal DOCK output from the delay circuit 18 and the external clock signal EXCK output from the clock input buffer 12. More specifically, the PLL circuit for output timing control PLO adjusts the phase of the external clock signal EXCK output from the clock input buffer 12 so as to be in phase with the delay clock signal output from the delay circuit 18. The PLL circuit for output timing control PLO outputs an internal clock signal for transmission TCK to the output circuit 19. The PLL circuit for output timing control PLO also outputs a feedback signal TFS generated based on the internal clock signal for transmission TCK to the delay circuit 18 as well.

The delay circuit 18 adds a predetermined delay time to the feedback signal TFS, to output the delayed clock signal DOCK to the PLL circuit for output timing control PLO.

The output circuit 19 acquires output data output through the bus 106 based on the internal clock for transmission TCK output from the PLL circuit for output timing control PLO, to output the internal output data IntDOUT output to an external device or the like to the data output buffer 13.

<Configuration Example of PLL Circuit>

Figure 3:
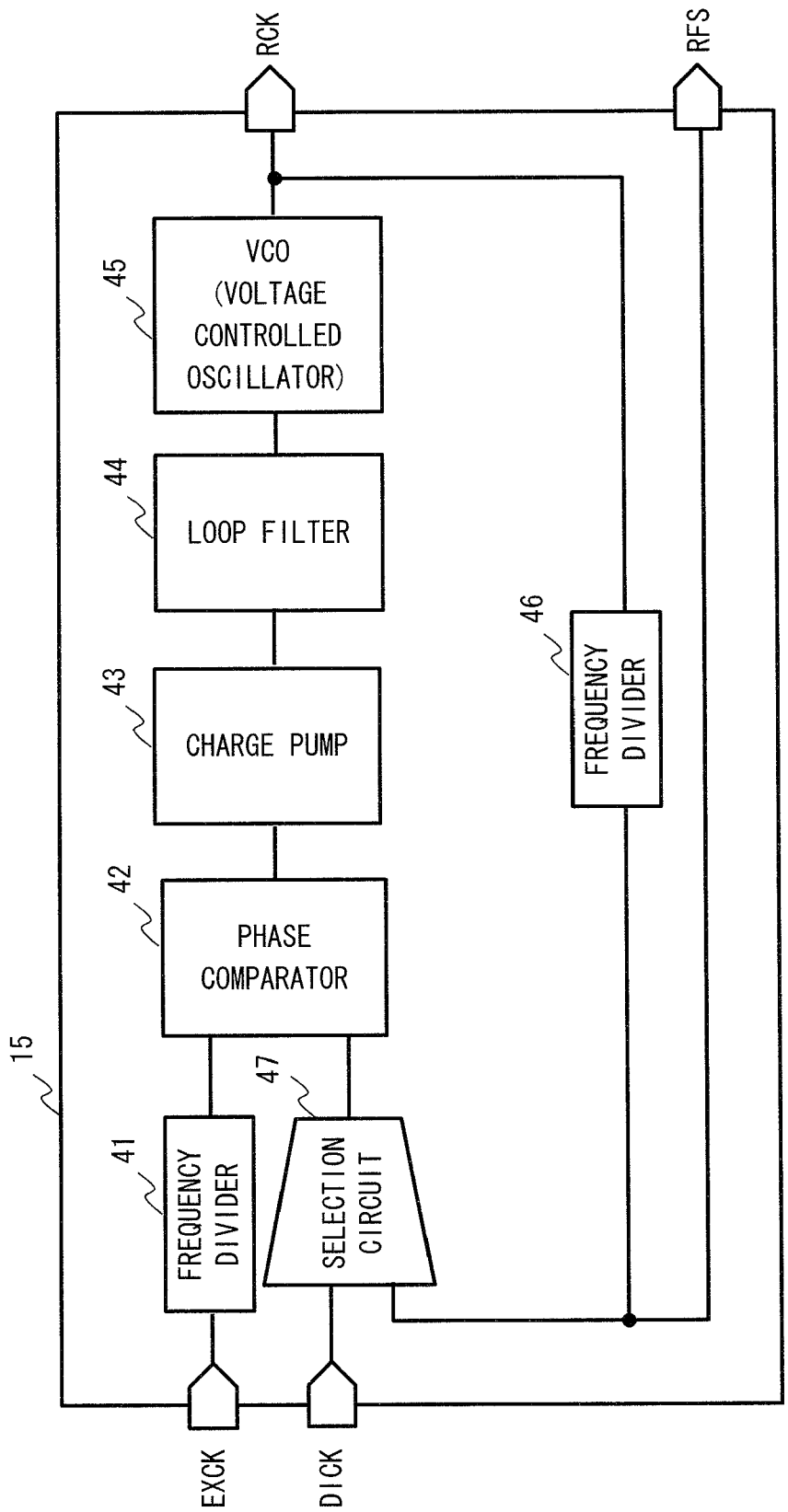
FIG. 3 is a configuration diagram of a PLL circuit for control according to the first embodiment.

Subsequently, with reference to FIG. 3, a configuration example of the PLL circuit for input timing control PLI included in the communication controller CC shown in FIG. 2 will be described. Since the PLL circuit for output timing control PLO has a similar configuration as the PLL circuit for input timing control PLI, detailed description thereof will be omitted.

The PLL circuit for input timing control PLI includes a frequency divider 41, a phase comparator 42, a charge pump 43, a loop filter 44, a VCO 45, a frequency divider 46, and a selection circuit 47.

The frequency divider 41 divides a frequency of the external input clock signal EXCK input to the PLL circuit for input timing control PLI to output the frequency-divided signal to the phase comparator 42. The phase comparator 42 compares a phase of the signal output from the frequency divider 41 with a phase of the signal output from the selection circuit 47. The phase comparator 42 outputs a voltage corresponding to a phase difference between the signal output from the frequency divider 41 and the signal output from the selection circuit 47 to the charge pump 43. The charge pump 43 boosts the voltage output from the phase comparator 42. The charge pump 43 outputs the boosted voltage to the loop filter 44.

A low-pass filter is used, for example, as the loop filter 44. The loop filter 44 interrupts unwanted fluctuations of the voltage. The loop filter 44 outputs the voltage in which unwanted fluctuations are interrupted to the VCO 45. The VCO 45 determines an output frequency according to the input voltage to output the signal (RCK) set to the output frequency that is determined to the input circuit 14. The frequency divider 46 divides the output frequency of the signal output from the VCO 45, and outputs the frequency-divided signal (RFS) to the selection circuit 47 and the delay circuit 16. The selection circuit 47 selects one of the signal output from the external circuit of the PLL circuit for input timing control PLI, e.g., the signal (DICK) output from the delay circuit 16, and the signal (RFS) output from the frequency divider 46, to output the selected signal to the phase comparator 42.

<Timing Chart of Communication Controller>

Figure 4:
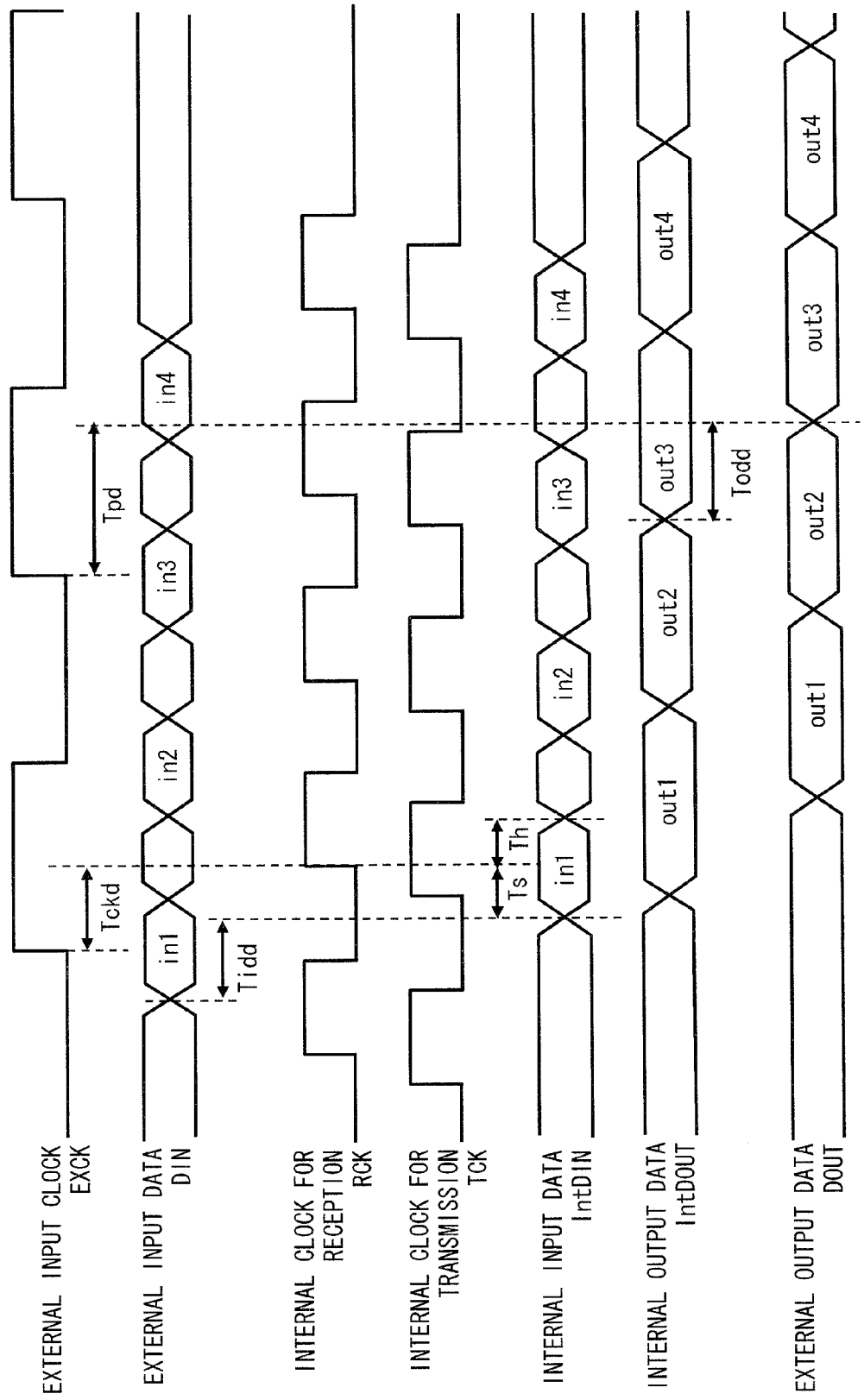
FIG. 4 is a timing chart showing an operation of the communication controller according to the first embodiment.

Subsequently, with reference to FIG. 4, a timing chart in the communication controller CC will be described. A period Tckd indicates a phase difference between the external input clock EXCK and the internal input clock for reception RCK. The phase difference Tckd includes a delay time in the clock input buffer 12, a delay time in the delay circuit 16, and a timing adjustment time in the PLL circuit for input timing control PLI.

A period Tidd indicates a phase difference between the external input data DIN and the internal input data IntDIN. The period Tidd includes a delay time in the data input buffer 11.

A period Ts is a setup time of the internal input data (D1), and a period Th is a hold time of the internal input data (D1). The phase of the internal clock for reception RCK is adjusted using the PLL circuit for input timing control PLI and the delay circuit 16 so as to satisfy the setup time Ts and the hold time Th when the internal input data IntDIN is acquired. The period Ts and the period Th are predetermined so as to satisfy the specification of the interface IC 127, for example.

A period Todd indicates a phase difference between the internal output data IntDOUT and the external output data DOUT. The period Todd includes a delay time in the data output buffer 13. A period Tpd is a delay time from when the external input clock EXCK is input to when the external output data DOUT is output. It is required that the minimum value and the maximum value of the delay time Tpd are within predetermined values. The phase of the internal clock for transmission TCK is adjusted using the PLL circuit for output timing control PLO and the delay circuit 18 so that the external output data output through the data output terminal satisfies the predetermined delay time Tpd.

Since the data input buffer 11 and the clock input buffer 12 have the same circuit configuration, the delay time added in the data input buffer 11 and the delay time added in the clock input buffer 12 are substantially the same. Accordingly, the PLL circuit for input timing control PLI only adjusts a rising timing of the internal clock for reception RCK so as to satisfy the setup time Ts and the hold time Th when the input circuit 14 acquires the external input data IntDIN output from the data input buffer 11. In summary, since the rising timing of the internal clock for reception RCK is adjusted without considering the delay time in the data input buffer 11 and the clock input buffer 12, the delay circuit 16 is configured to give a short delay time compared to the delay circuit 18.

As described above, the semiconductor device according to the first embodiment includes the PLL circuit for input timing control PLI and the PLL circuit for output timing control PLO. The PLL circuit for input timing control PLI generates the internal clock for reception RCK, and the PLL circuit for output timing control PLO generates the internal clock for transmission TCK. The internal clock for reception RCK and the internal clock for transmission TCK are generated independently from each other. Therefore, the phase of the internal clock for reception RCK is adjusted in the PLL circuit for input timing control PLI so as to satisfy the setup time Ts and the hold time Th that are determined in advance. Furthermore, since the phase of the internal clock for transmission TCK is adjusted in the PLL circuit for output timing control PLO so as to satisfy the predetermined delay time Tpd, it is possible to satisfy the setup time Ts, the hold time Th, and the delay time Tpd at the same time.

Even when there is a variation change due to an environmental change such as a temperature change in a manufacturing process, e.g., a variation in delay time in the data output buffer 13, it is possible to adjust the phase of any one of the internal clock for reception RCK and the internal clock for transmission TCK. In summary, by using the PLL circuit for input timing control PLI and the PLL circuit for output timing control PLO, it is possible to adjust the phase of any one of the internal clock for reception RCK and the internal clock for transmission TCK without giving any effect on the phase of the other input clock.

Consider a case in which the PLL circuit for input timing control and the PLL circuit for output timing control are provided, as is similar to this embodiment, to a semiconductor device which operates in a low-speed clock (as one example, about 33 MHz). In such a semiconductor device which operates in a low-speed clock, it is possible to satisfy the specification of the setup time Ts, the hold time Th, the delay time Tpd and the like in a relatively easy way even when a PLL circuit is not used. If two PLL circuits for control are provided to such a semiconductor device as in this embodiment, this causes an increase in circuit size and an increase in chip size, which causes more disadvantages than advantages. Accordingly, this embodiment is preferably applied to a semiconductor device which operates in a high-speed clock (as one example, 00 MHZ or larger).

(Second Embodiment)

<Configuration Example of Communication Controller>

Figure 5:
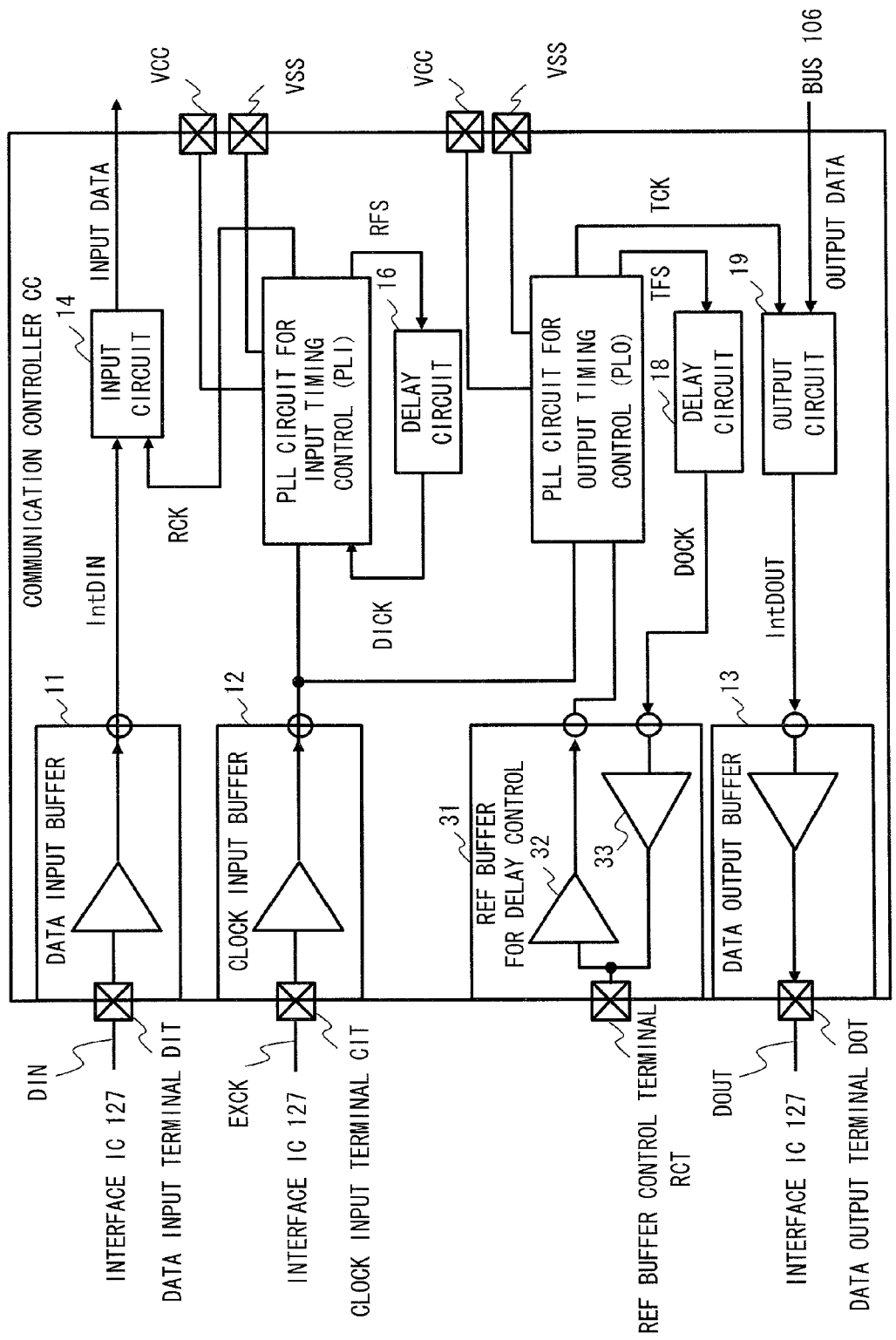
FIG. 5 is a configuration diagram of a communication controller according to a second embodiment.

Subsequently, with reference to FIG. 5, a configuration example of a communication controller CC according to a second embodiment will be described. Only the difference from the communication controller CC shown in FIG. 2 will be mainly described here, and detailed description of the common configuration will be omitted. In the communication controller CC shown in FIG. 5, an REF buffer for delay control 31 is added to the communication controller CC shown in FIG. 2.

The REF buffer for delay control 31 includes an input buffer 32 and an output buffer 33. The output buffer 33 temporarily stores the delayed clock signal DOCK output from the delay circuit 18. The output buffer 33 outputs the delayed clock signal DOCK that is temporarily stored to the input buffer 32. The input buffer 32 temporarily stores the delayed clock signal DOCK output from the output buffer 33. The input buffer 32 outputs the delayed clock signal DOCK that is temporarily stored to the PLL circuit for output timing control PLO.

More specifically, the REF buffer for delay control 31 temporarily stores the delayed clock signal DOCK output from the delay circuit 18 in the input buffer 32 and the output buffer 33 to add further delay, and outputs the delayed clock signal DOCK to the PLL circuit for output timing control PLO. The delay time is added to the internal clock signal for transmission TCK output from the PLL circuit for output timing control PLO in the delay circuit 18, the output buffer 33, and the input buffer 32, and the internal clock signal TCK to which the delay time is added is input to the PLL circuit for output timing control PLO. The external clock signal EXCK input to the PLL circuit for output timing control PLO and the delayed clock signal DOCK input to the PLL circuit for output timing control PLO through the delay circuit 18 and the like are controlled to have the same phase. Accordingly, the phase of the internal clock signal for transmission TCK output from the PLL circuit for output timing control PLO is advanced compared to the phase of the external clock signal EXCK input to the PLL circuit for output timing control PLO by the amount corresponding to the delay time added by the delay circuit 18, the output buffer 33, and the input buffer 32.

Since the input buffer 32 and the clock input buffer 12 use the same circuit configuration, substantially the same delay time is added in the input buffer 32 and the clock input buffer 12. Further, since the output buffer 33 and the data output buffer use the same circuit configuration, substantially the same delay time is added in the output buffer 33 and the data output buffer. Further, the load condition similar to an external load condition that gives an effect to the delays in the clock input buffer 12 and the data output buffer 13 is input to the REF buffer for delay control 31 through an REF buffer control terminal RCT. Therefore, the delay time added in the clock input terminal 12 and the delay time added in the input buffer 32 to advance the phase are substantially the same, and the delay time added in the data output terminal 13 and the delay time added in the output buffer 33 to advance the phase are substantially the same. Accordingly, the delay time added in the clock input terminal 12 and the delay time added in the data output terminal 13 are cancelled out by providing the REF buffer for delay control 31. Accordingly, in the delay circuit 18, the delay time that is added is set so as to adjust transmission delays in a communication path or the like of clock signals and to satisfy the delay time Tpd.

As described above, the semiconductor device according to the second embodiment includes the PLL circuit for input timing control PLI and the PLL circuit for output timing control PLO. The PLL circuit for input timing control PLI generates the internal clock for reception RCK, and the PLL circuit for output timing control PLO generates the internal clock for transmission TCK. The internal clock for reception RCK and the internal clock for transmission TCK are generated separately from each other. Accordingly, by adjusting the phase of the internal clock for reception RCK by the PLL circuit for input timing control PLI so as to satisfy the setup time Ts and the hold time Th that are determined in advance and adjusting the phase of the internal clock for transmission TCK by the PLL circuit for output timing control PLO so as to satisfy the predetermined delay time Tpd, the setup time Ts, the hold time Th, and the delay time Tpd can be simultaneously satisfied. In particular, in order to adjust the delay time Tpd, the delay circuit 18, the input buffer 32, and the output buffer 33 are used.

While the present invention made by the present inventors has been described in detail based on the embodiments, it is needless to say that the present invention is not limited to the embodiments, but may be variously changed without departing from the spirit of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first and second embodiments can be combined as desirable by one of ordinary skill in the art.

What is claimed is:

1. A semiconductor device comprising a communication controller, the communication controller comprising:
   (a) a clock input circuit that receives an external clock signal;
   (b) a first PLL circuit that performs phase adjustment between the external clock signal and a first delay clock signal to generate a first internal clock signal used to acquire input data;
   (c) a first delay circuit that delays a first feedback signal outputted from the first PLL circuit to thereby generate the first clock signal, and outputs the first delay clock signal to the first PLL circuit;
   (d) a second PLL circuit that performs phase adjustment between the external clock signal and a second delay clock signal to generate a second internal clock signal used to output output data; and
   (e) a second delay circuit that delays a second feedback signal outputted from the second PLL circuit to thereby generate the second clock signal, and outputs the second delay clock signal to the second PLL circuit.

2. The semiconductor device according to claim 1, wherein an output timing of the first internal clock signal output from the first PLL circuit is determined based on a delay amount in the first delay circuit.

3. The semiconductor device according to claim 2, wherein the first delay circuit determines a delay amount of the first delay clock signal so that the input data satisfies a setup time and a hold time that are determined in advance.

4. The semiconductor device according to claim 1, further comprising a data input circuit that receives the input data,
   wherein the data input circuit and the clock input circuit use substantially the same circuit.

5. The semiconductor device according to claim 1, wherein an output timing of the second internal clock signal output from the second PLL circuit is determined based on a delay amount in the second delay circuit.

6. The semiconductor device according to claim 5, wherein the delay amount in the second delay circuit is determined so that the output data is output within a predetermined period of time after the external clock signal is input.

7. The semiconductor device according to claim 6, further comprising an output circuit that outputs the output data,
   wherein the delay amount in the second delay circuit is determined so that the output data to which a delay time is added in the output circuit is output within the predetermined period of time after the external clock signal is input.

8. The semiconductor device according to claim 1, wherein the second delay signal is input to the second PLL circuit through the second delay circuit, a first input circuit that is substantially the same as an input circuit that receives the input data, and a first output circuit that is substantially the same as an output circuit that outputs the output data.

9. A semiconductor device comprising:
   (a) a communication controller comprising:
      (i) a clock input circuit that receives an external clock signal;
      (ii) a first PLL circuit that performs phase adjustment between the external clock signal and a first delay clock signal to generate a first internal clock signal used to acquire input data;

(iii) a first delay circuit that delays a first feedback signal outputted from the first PLL circuit to thereby generate the first clock signal, and outputs the first delay clock signal to the first PLL circuit;

(iv) a second PLL circuit that performs phase adjustment between the external clock signal and a second delay clock signal to generate a second internal clock signal used to output output data; and (v) a second delay circuit that delays a second feedback signal outputted from the second PLL circuit to thereby generate the second clock signal, and outputs the second delay clock signal to the second PLL circuit; and (b) a module controller that controls the communication controller using a program stored in a memory.

10. The semiconductor device according to claim 9, wherein the communication controller is connected to an interface IC.

11. An electronic device comprising:

(a) a communication controller comprising:

(i) a clock input circuit that receives an external clock signal;

(ii) a first PLL circuit that performs phase adjustment between the external clock signal and a first delay clock signal to generate a first internal clock signal used to acquire input data;

(iii) a first delay circuit that delays a first feedback signal outputted from the first PLL circuit to thereby generate the first clock signal, and outputs the first delay clock signal to the first PLL circuit;

(iv) a second PLL circuit that performs phase adjustment between the external clock signal and a second delay clock signal to generate a second internal clock signal used to output output data; and (v) a second delay circuit that delays a second feedback signal outputted from the second PLL circuit to thereby generate the second clock signal, and outputs the second delay clock signal to the second PLL circuit;

(b) a module controller that controls a module including the communication controller using a program stored in a memory; and (c) an external device connected to the module.

12. The electronic device according to claim 11, wherein the electronic device is a car navigation system.

* * * * *